United States Patent [19]

Murmann

[11] 4,354,080
[45] Oct. 12, 1982

[54] LIGHTED CODING SWITCH

[75] Inventor: Guenter Murmann, Pegnitz, Fed. Rep. of Germany

[73] Assignee: Cherry Electrical Products Corporation, Waukegan, Ill.

[21] Appl. No.: 204,275

[22] Filed: Nov. 5, 1980

[30] Foreign Application Priority Data

Nov. 5, 1979 [DE] Fed. Rep. of Germany ... 7931211[U]
Sep. 30, 1980 [DE] Fed. Rep. of Germany ... 8026144[U]

[51] Int. Cl.³ .............................................. H01H 9/00
[52] U.S. Cl. ................................................... 200/316
[58] Field of Search ............... 200/316, 292, 308, 310, 200/155 R, 11 TW; 74/143, 575; 335/140

[56] References Cited

U.S. PATENT DOCUMENTS 4,112,278 9/1975 Greiner et al. ...................... 200/156

FOREIGN PATENT DOCUMENTS 2219807 10/1973 Fed. Rep. of Germany ...... 200/316
7715970 5/1977 Fed. Rep. of Germany .
2559850 11/1978 Fed. Rep. of Germany ...... 200/156

Primary Examiner—Willis Little
Attorney, Agent, or Firm—Hume, Clement, Brinks, Willian & Olds, Ltd.

[57] ABSTRACT

An improved lighted coding switch generates binary coded signals corresponding to selected numerals that are displayed in a window of the switch. The numerals are inscribed on a translucent peripheral wall of an encoding wheel that brushes switch contacts against a printed circuit board to define binary signals as the wheel rotates. When the wheel is at rest, a particular numeral is displayed in the window of the switch and the switch contacts of the wheel define an associated binary coded signal. The symbol that is positioned in the window is illuminated by a light emitting diode that is positioned to irradiate a portion of an annular area defined between the peripheral wall of the wheel and an inner hub of the wheel. The LED is inserted into the switch through an aperture in a back wall and the power wires of the LED are inserted through another aperture in the wall and are conductively connected to upstanding pins of the printed circuit board. A back plate is affixed to the switch to cover the light emitting diode and its wires.

13 Claims, 6 Drawing Figures

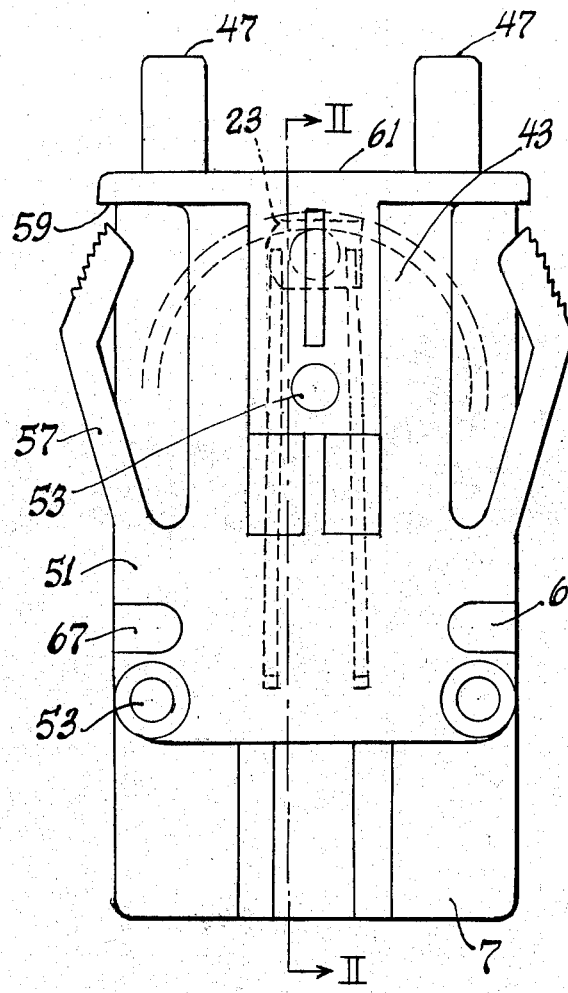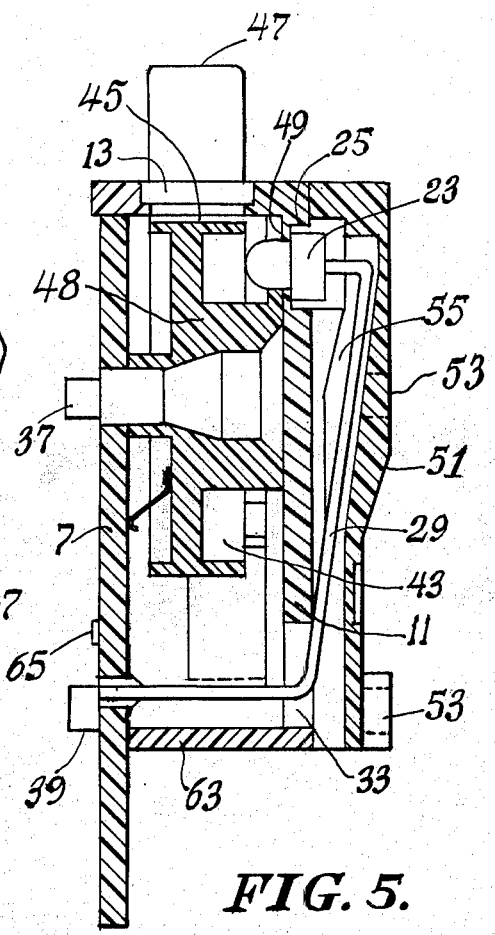
FIG 4.
FIG. 5.
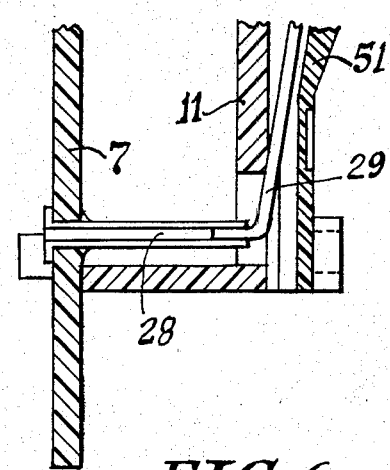
FIG. 6.

LIGHTED CODING SWITCH

BACKGROUND OF THE INVENTION

The invention relates to coding switches that generate binary signals representative of selected numbers inscribed on an encoding wheel and more particularly, to coding switches that employ a light emitting diode to illuminate a selected number on the wheel.

Coding switches are utilized in digital systems to generate binary signals corresponding to selected decimal numbers. A known coding switch utilizes a rotatively mounted encoding wheel to generate binary signals representative of numerals that are inscribed on a translucent peripheral wall of the wheel. A light emitting diode (LED) is provided to illuminate a selected numeral of the wheel.

The LED is mounted within the switch and is powered by means of wires that are connected to power input points of a printed circuit board of the switch. The wires are bent around the edge of the encoding wheel and are soldered to the printed circuit board.

The above-indicated LED power connection for the known switch is undesirable, since the LED power wires may interfere with the movement of the encoding wheel. Also, the wires may rub against the encoding wheel and thereby transmit undesirable vibrations to the LED when the encoding wheel is rotated. Moreover, if the wires rub against the wheel, it is likely that the wires will be either broken or shorted together.

The placement of the LED and the routing of its wires within the known switch also complicates the assembly process, since the wires must be soldered to the printed circuit board and bent around the wheel and the soldered wires, wheel and printed circuit board must then be positioned in a switch housing as a unit. Moreover, if the LED is damaged or is otherwise rendered inoperable, it may be replaced only by dismantling the entire switch.

Another coding switch is disclosed in a German Application No. G7715970. The switch utilizes an encoding wheel to generate signals representative of numbers inscribed on a translucent peripheral wall of the wheel. A light source is mounted within the hub of the wheel to illuminate a selected number on the peripheral wall.

The axially mounted light source vibrates as the wheel is rotated. The vibration may reduce the life of the light source and may also tend to break the power wires. Also, the light source is relatively distant from the peripheral wall of the encoding wheel and therefore, the source must be operated at an undesirably high power in order to illuminate the numbers of the wheel. The high power operation of the light source may reduce the life of the source and may also unduly heat and expand the components of the encoding wheel.

It may be necessary to increase the clearance between components in order to compensate for such heat-induced expansion. However, the increased clearance may adversely affect the precision of operation of the switch and may also result in an increased vibration of the switch and a corresponding decrease in the life of the light source. Moreover, the light source must be dimensioned relatively precisely to fit in the hub of the encoding wheel and therefore, it is expected that the source will be relatively expensive and that the range of commercially available replacements for the light source will be limited.

Accordingly, it is an object of the invention to provide a simple and relatively inexpensive coding switch with a light source that may be easily replaced without dismantling the switch.

A further object of the invention is to provide such a coding switch wherein the light source of the switch is a light emitting diode that may be operated at a relatively low power to satisfactorily illuminate symbols inscribed on a peripheral wall of an encoding wheel.

Another object of the invention is to provide a means for connecting the light emitting diode of a lighted coding switch so that the wires of the diode are not rubbed against moving components of the switch or exposed to undesirable stresses as the switch is operated.

A further object of the invention is to provide a lighted coding switch wherein the light emitting diode of the switch is not vibrated as the switch is operated.

If the power wires of a light emitting diode are supported in grooves at the back of a switch, the wires may be shorted together if the switch is pressed against conducting elements of an adjacent switch. For example, if switches are stacked, the exposed metallic areas of a circuit board of one switch may press against and short out the wires at the back of an adjacent switch. Also, the wires of a switch may rub together and short one another out.

Accordingly, it is a further object of the invention to provide a lighted coding switch with a back panel that separates the wires of a light emitting diode of the switch and covers the wires to prevent the wires from contacting metal components of an adjacent switch.

If lighted coding switches are arranged in a stacked relation, it is also desirable to space adjacent switches sufficiently far apart so that a desired switch may be operated without inadvertently operating an adjacent switch.

Accordingly, it is an object of the invention to provide a switch back plate that not only protects the power wires of a light emitting diode of the switch but also provides a means for spacing the switch a convenient distance from an adjacent switch.

If the light emitting diode of a lighted coding switch is positioned in a space defined between a peripheral wall of an encoding wheel and the hub of the wheel, the radial dimension of the wheel must be sufficiently large to accommodate the LED. Thus, if a substantial reduction in size is required for the switch and its encoding wheel, the indicated positioning of the LED will unduly limit the reduction in size that may be obtained.

Accordingly, it is an object of the invention to provide a means for positioning a light emitting diode of a lighted coding switch so that the dimensions of the switch may be reduced.

BRIEF SUMMARY OF THE INVENTION

In order to achieve the objects of the invention and to overcome the problems of the prior art, the lighted coding switch of the invention includes an encoding wheel that is rotated to generate coded signals corresponding to symbols that are inscribed on a translucent peripheral wall of the wheel. In operation, the encoding wheel is incrementally rotated to position a symbol of the wheel beneath a window of the switch and to move contact fingers of the switch against conducting areas of a printed circuit board. The conductive connections between the contact fingers and printed circuit board define a digital signal for the displayed symbol.

A light emitting diode is inserted in an aperture in the back wall of the switch and is positioned to irradiate the translucent wall of the encoding wheel so that the displayed symbol is illuminated. Power wires of the light emitting diode are positioned in grooves in the back wall of the switch and are connected to power supply points on the printed circuit board through another aperture in the back wall of the switch.

In a preferred embodiment of the invention, the light emitting diode is positioned outside of an annular area between the peripheral wall of the encoding wheel and the hub of the wheel, so that the diameter of the wheel may be made as small as possible. Also, the power wires of the light emitting diode are connected to upstanding pins of the printed circuit board.

A back plate covers the light emitting diode and its wires so that the diode and wires are protected from the printed circuit board of an adjacent switch, when switches are stacked. The back plate also serves to space switches in the stack. The back plate has an insulating rib that is employed to separate the power wires of the diode.

BRIEF DESCRIPTION OF THE DRAWINGS

FIG. 4 illustrates a plan view of a preferred embodiment of a miniature lighted coding switch, in accordance with the invention.

FIG. 5 illustrates a cross-sectional view of the coding switch of FIG. 3, taken along a line II—II.

FIG. 6 illustrates a partial cross-sectional view of a printed circuit board connection for the coding switch of FIG. 4, taken along a line II—II.

DETAILED DESCRIPTION OF PREFERRED EMBODIMENTS

Figure 1:
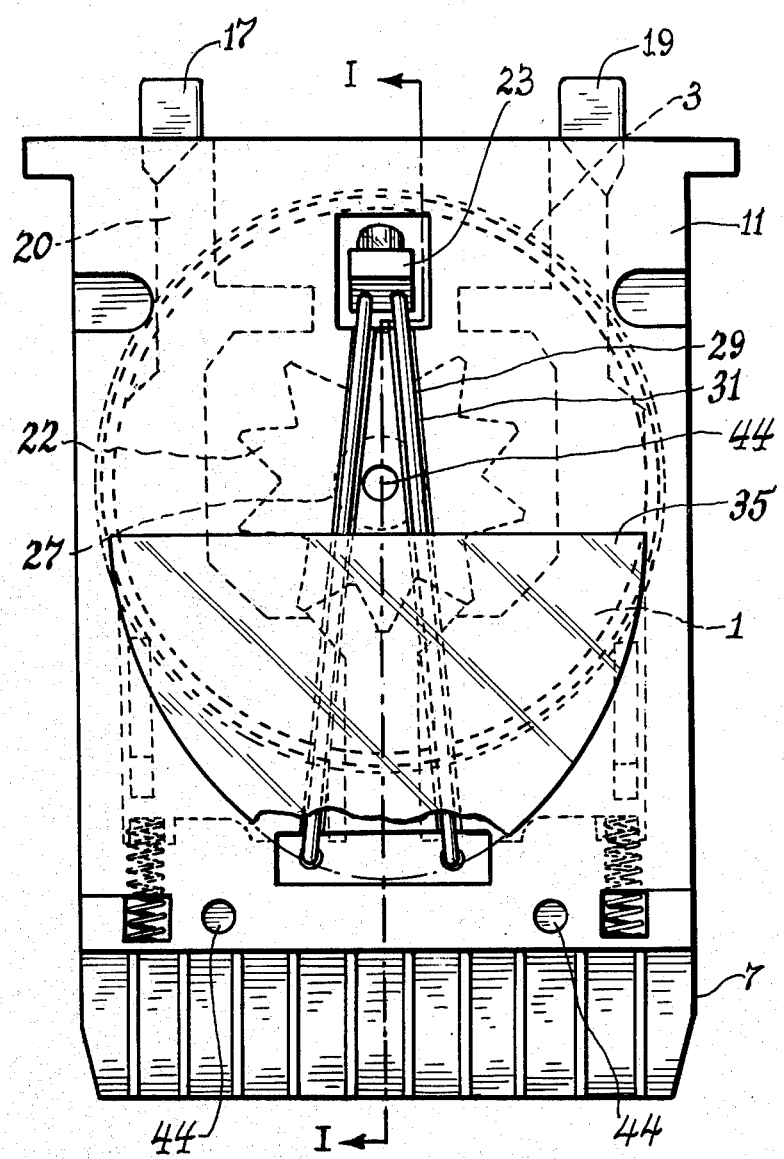
FIG. 1 illustrates a plan view of a lighted coding switch, in accordance with the invention.

The remaining portion of this specification will describe preferred embodiments of the invention when read in conjunction with the attached drawings, in which like reference characters designate identical apparatus.

Figure 2:
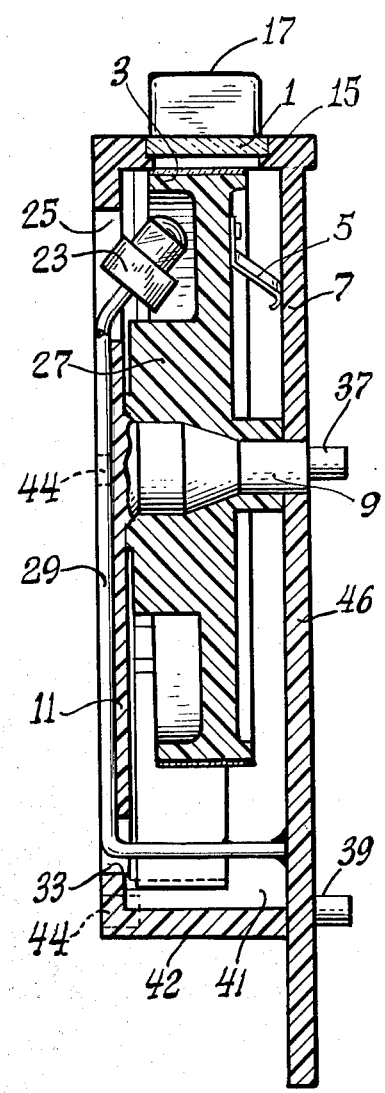
FIG. 2 illustrates a cross-sectional view of the coding switch of FIG. 1, taken along a line I—I.

FIG. 1 illustrates a plan view of a lighted coding switch of the invention and FIG. 2 illustrates a cross-sectional view of the switch of FIG. 1, taken along a line I—I. The switch of FIGS. 1 and 2 utilizes a rotating encoding wheel 1 to define coded digital signals corresponding to symbols that are inscribed along a translucent peripheral wall 3 of the wheel. More particularly, as is known to those skilled in the art, the encoding wheel 1 supports a plurality of contact fingers 5 that press against conducting areas of the inside surface of a printed circuit board 7. As the encoding wheel 1 rotates about a shaft 9 formed in a back wall 11 of the switch, for example by injection molding, the contact fingers 5 establish conductive connections between different conducting areas of the printed circuit board and thereby define the coded output signals.

It should be understood that for a particular angular position of the encoding wheel 1 a symbol will be positioned on the peripheral wall 3 adjacent to a transparent window 13 that is disposed in the front face 15 of the switch. The position of the contact fingers 5 with respect to the printed circuit board 7 will then define a particular digital output signal corresponding to the symbol that is displayed in the window 13. In the preferred embodiment of FIG. 1, the switch is operated to generate binary coded decimal signals for numerals that are inscribed on the peripheral wall of the wheel.

Figure 3:
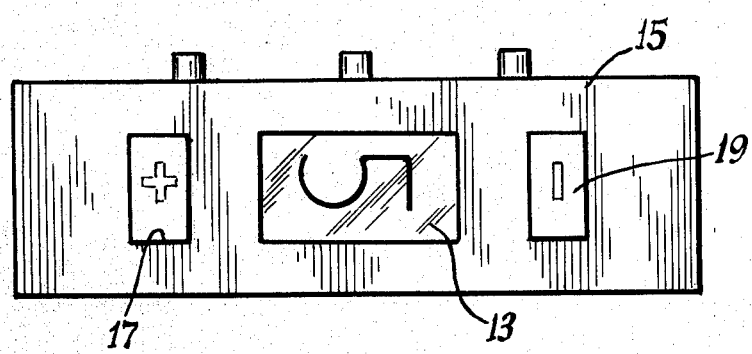
FIG. 3 illustrates a top elevation view of the coding switch of FIG. 1.

FIG. 3 illustrates a top elevation view of the face 15 of the switch of FIGS. 1 and 2. As indicated above, the window 13 displays a symbol inscribed on the peripheral wall 3 of the encoding wheel 1, for example the numeral 5. For a preferred embodiment of the invention, the peripheral wall 3 of the encoding wheel has the numerals 0 through 9 inscribed in sequence.

A first push-button 17 is provided to selectively increment the number that is displayed in the window 13. Thus, for example, if a 5 is displayed in the window and the push-button 17 is pressed, the wheel 1 will rotate so that the next successive numeral 6 will appear in the window and the contact fingers 5 will define a corresponding code for the newly selected numeral. The numerals of the encoding wheel may be displayed in a decrementing sequence by pushing a second push-button 19. Thus, an operator may easily select any particular numeral on the wheel and thereby cause the switch to generate a corresponding digital code.

The push-buttons 17 and 19 each operate spring-biased ratchet arms 20 which engage gear teeth 22 that are formed in the hub 27 of the wheel. When a button is pushed, its arm engages the gear of the hub 27 and rotates the wheel an incremental distance in the selected direction. The output signals of the switch are applied at conducting areas 21 of the printed circuit board 7.

The numerals on the translucent peripheral wall 3 of the encoding wheel 1 are illuminated by a light source, for example a light emitting diode (LED) 23. The LED 23 extends through an aperture 25 in the back wall 11 of the switch and is positioned between the peripheral wall 3 and the hub 27 of the encoding wheel 1. Power is supplied to the LED 23 by power wires 29 that lie in grooves 31 formed in the back wall 11. The wires 29 extend along the grooves 31 over the outside surface of the back wall 11 to an aperture 33. As shown in FIG. 2, the wires 29 extend through the aperture 33 and are conductively connected, for example by soldering, to corresponding power supply areas of the printed circuit board 7. An insulating sheet 35 may be adhered to the wall 11 to cover the power wires 29 and to hold the wires in place.

The switch has a central peg 37 that is formed at the end of the shaft 9 and that extends through a corresponding hole in the printed circuit board 7. The central peg 37 remains stationary, since the shaft 9 is formed in the back wall 11. The switch also has two end pegs 39 that extend through corresponding holes in the printed circuit board 7 and that are formed from cylindrical posts 41 that are molded in the housing 42 of the switch.

A plurality of switches constructed in accordance with FIGS. 1–3 may be connected in a stacked relation to define a data word having any number of digits or other symbols. Switches are arranged in a stack by engaging the pegs 37 and 39 of each switch in corresponding holes 44 of an adjacent switch.

It should be understood that when the pegs 37 and 39 of an engaging switch are inserted into the corresponding holes 44 of an adjacent switch, the back wall 11 of the adjacent switch will be pressed against the outside surface 46 of the printed circuit board of the engaging switch. If the outer surface of the circuit board of the engaging switch has conducting metal areas, the metal areas may press against and short out the wires 29 of the LED of the adjacent switch. Although the insulating sheet 35 may be employed to cover and insulate the wires of the LED, it would be desirable to provide a more durable means for protecting the wires. Also, when the relatively small switches of FIGS. 1-3 are snapped together, it is desirable to provide a means for slightly spacing the switches apart from one another so that an operator will not inadvertently operate a switch that is adjacent to a particular selected switch.

Moreover, as shown in FIG. 2, the LED 23 is inserted in the annular space between the peripheral wall 3 and hub 27 of the encoding wheel 1. The indicated placement of the LED 23 makes it necessary to provide a particular radial distance between the wall and hub of the encoding wheel and therefore, limits the extent to which the encoding wheel 1 may be radially reduced in size to provide a smaller switch.

FIGS. 4-6 illustrate a preferred embodiment of a miniature switch of the invention wherein the light emitting diode 23 is positioned so that the encoding wheel 1 may be radially reduced in size. Such a switch is required, for example in applications where there is limited space on a control console. Also, the switch of FIGS. 4-6 is constructed to provide insulating protection for the LED power wires at the back of the switch and to further insulate the wires from one another.

FIG. 4 is a plan view of a miniature switch, in accordance with the invention and FIG. 5 is a cross-sectional view of the switch of FIG. 4, taken along a line II—II. As shown in FIG. 5, the switch includes an encoding wheel 43 that is substantially reduced in size. The encoding wheel 43 has a translucent peripheral wall 45 on which numbers or other symbols are inscribed. As indicated above, push-buttons 47 operate a ratchet mechanism to rotate the encoding wheel 43 in a desired direction. More particularly, the buttons 47 cause spring-biased ratchet arms to reciprocate and to thereby engage gear teeth formed in the hub 48 of the wheel. Each time that a button 47 is pressed, its associated ratchet arm engages the hub 48 to move the encoding wheel 43 a particular angular distance.

The reduction in the size of the encoding wheel 43 is achieved by positioning the LED 23 so that it is no longer disposed in the annular space between the peripheral wall 45 and hub 48 of the wheel. The LED 23 of FIG. 5 is held in its indicated position within an aperture 25 of the back wall 11 by a collar 49 that is formed in the wall 11. It should be understood that, in assembling the switch, the LED 23 is pressed into the aperture 25 until the collar 49 stops its movement into the switch.

The LED 23 is oriented to irradiate the outer peripheral wall 45 of the encoding wheel 43 so that a symbol on the surface of the peripheral wall of the wheel is illuminated in the window 13. The collar 49 also provides a light-tight seal for the LED 23.

As shown in FIG. 5, the wires 29 of the LED 23 are routed along the back wall 11, inserted through the rear aperture 33 of the wall 11 and connected to the printed circuit board 7, for example by soldering. A back plate 51 is then snapped into place to cover the LED 23 and its associated wires 29. The insulating back plate 51 serves to protect the LED 23 and to cover the wires 29 so that the wires will not be shorted against metal components of an adjacent switch, for example when the adjacent switch engages its pegs 37 and 39 in corresponding apertures 53 of the back plate and presses its printed circuit board against the back plate.

The back plate 51 also serves to space each switch slightly from an adjacent engaging switch, in order to make it easier to operate a switch without inadvertently activating an adjacent switch. Moreover, the back plate 51 has a central insulating rib 55 that is positioned between the wires 29 of the LED 23 to insulate the wires from one another.

With reference to FIG. 4, it can be seen that the back plate 51 is shaped to provide retaining fingers 57 that are employed to hold the switch firmly in an aperture of an instrument panel. More particularly, the fingers 57 serve to press a flange 59 of the face 61 of the switch against the peripheral edge of an aperture in an instrument panel.

The printed circuit board 7 is affixed to the housing 63 of the switch of FIG. 5 by pegs 65 that extend from the housing 63 and pass through aligned apertures in the printed circuit board 7. The pegs 65 are then staked over at their ends to retain the printed circuit board against the housing 63. Slots 67 are formed in the back plate 51 to provide clearance for the staked-over pegs of an adjacent engaged switch.

FIG. 6 illustrates a partial cross-sectional view of an apparatus for connecting the wires 29 of the LED with the printed circuit board 7. More particularly, a hollow pin 28 is conductively connected to a desired area of the printed circuit board, for example by soldering and a corresponding wire 29 of the LED is inserted and soldered into the end of the pin. Alternatively, the end of the wire 29 may be conductively affixed to a connector that plugs into the hollow pin or the hollow pin may include apparatus that grips the end of the wire. If desired, the wire 29 could possibly be wire-wrapped around the upstanding pin 28, in a manner known to the art.

It should be understood that the use of the pin 28 will facilitate the attachment of the light emitting diode to the coding switch. Thus, a coding switch may be initially constructed without an LED and the LED may be easily retrofitted into the switch by removing the back cover 51, inserting the LED into the aperture 25 and conductively affixing the ends of the wires 29 to the upstanding pins 28. Thereafter, the backplate 51 may be snapped into place. Also, if an LED of a switch burns out or is otherwise damaged, it may be readily replaced by disconnecting the wires 29 from the upstanding pins 28, pulling the LED from the aperture 25 and inserting a new LED in the above-indicated fashion.

It should be appreciated that the above-described coding switch of FIGS. 4-6 may be assembled in a relatively simple and straightforward manner. Thus, the encoding wheel 43 and associated spring-biased ratchet arms and push-buttons are initially assembled in the housing 63. Thereafter, the printed circuit board 7 is affixed to the housing 63 by staking over the upstanding pegs 65 of the housing 63. If it is desired to light the assembled switch, the wires 29 of an LED may be inserted through the aperture 33 of the wall 11 and either soldered to the printed circuit board 7 or conductively affixed to upstanding pins 28, if the pins are provided. The portions of the wires 29 adjacent to the LED 23 are then bent and the LED 23 is inserted through the aperture 25 to press against the collar 49. Thereafter, the back plate 51 is snapped into place to cover the protruding LED 23 and wires 29.

It should be understood that the coding switch of the invention may be assembled in a different manner. For example, the wires 29 may be soldered or otherwise conductively affixed to the printed circuit board 7 as a first step in the assembly process. Thereafter, the encoding wheel 43, push-buttons and ratchet mechanism are inserted into the housing 63 and the LED 23 is passed outwardly through the aperture 33. The printed circuit board 7 is then fitted over the pegs 37 and 39 and is affixed to the housing 63 by staking over the upstanding pegs 65. The light emitting diode is then inserted into the aperture 25 and the back plate 51 is snapped into place, as described above.

Although assembly steps have been particularly described for the coding switch of FIGS. 4-6, it should be understood that similar steps may be employed to assemble the coding switch of FIGS. 1-3. It should be further understood that, if the wires 29 are soldered to the printed circuit board 7, the wires may be soldered by inserting a soldering iron through the aperture 33 or, if the contact holes in the printed circuit board are plated through, the wires may be soldered from the outside surface of the board.

It should be understood that a relatively small coding switch may be constructed in accordance with the above-described embodiments and a light emitting diode may be easily inserted into such a switch to illuminate selected numerals or other symbols. The LED is mounted so that it does not vibrate when the encoding wheel of the switch is rotated and the power wires of the LED are supported so that they do not touch the moving parts of the switch. The wires are also insulated from adjacent switches.

The rear insertion of the light emitting diode and the described rear insertion and conductive affixation of the wires 29 in the coding switch provides a simple and effective means for either adding an LED to a switch or changing an LED in the switch, without disassembling the switch. Moreover, the light emitting diode of the switch is oriented to illuminate a symbol of the switch in a manner that does not require an unduly large encoding wheel. Furthermore, the structure of the switch of the invention is such that the LED is positioned adjacent to the area to be lighted and, therefore, it is not necessary to energize the LED at undesirably high power levels. Also, the lower power requirement for the LED of the switch ensures that the components of the switch will not be unduly heated.

The invention may be embodied in other specific forms without departing from its spirit or essential characteristics. The present embodiments are, therefore, to be considered in all respects as illustrative and not restrictive, the scope of the invention being indicated by the claims rather than by the foregoing description. All changes which come within the meaning and range of the equivalents of the claims are, therefore, intended to be embraced therein.

I claim:

1. A lighted coding switch, comprising:
   an encoding wheel having a peripheral rim with symbols formed along its outside surface;
   means for selectively rotating the encoding wheel;
   a housing for retaining and rotatively supporting said encoding wheel, the housing including a back wall, a printed circuit board forming a front wall and peripheral side walls, one of said side walls having means for viewing a portion of the outside surface of the rim, the back wall having a light support aperture located adjacent to said means for viewing;
   a light source for illuminating the viewed portion of the rim;
   means for supporting the light source in said aperture and outside the area defined within the rim, so that the light source illuminates at least one symbol disposed within the viewed portion of the rim; and
   means for conductively engaging the printed circuit board as the coding wheel rotates for defining electrical signals representative of illuminated symbols of the viewed portion of the rim.

2. The coding switch of claim 1, wherein said light source is a light emitting diode.

3. The lighted coding switch of claim 1, wherein said back wall includes a power supply aperture located in spaced relation to the light support aperture, and wherein the lighted coding switch further includes electrical conductors for supplying energizing current to said light source, and means for connecting the conductors through the power supply aperture to said printed circuit board.

4. The coding switch of claim 3, wherein said means for connecting includes upstanding pins and means for conductively connecting the pins to the printed circuit board and the electrical conductors.

5. The coding switch of claim 3, further including a backplate for completely covering said light source and said electrical conductors to protect the light source and to insulate the conductors.

6. The coding switch of claim 5, wherein said backplate includes a rib for insulating the electrical conductors from each other.

7. The coding switch of claim 3, further including means for insulatedly connecting the coding switch in stacked relation to an adjacent switch, and a backplate for completely covering the light source and electrical conductors and for spacing the coding switch with respect to said adjacent switch.

8. The coding switch of claim 7, wherein said backplate includes means for insulating the electrical conductors from each other.

9. The coding switch of claim 3, wherein said back wall has grooves formed in its surface for retaining said electrical conductors and directing the conductors from said first aperture to said second aperture.

10. The coding switch of claim 1, wherein said means for selectively rotating includes
    a hub for defining a bearing for the encoding wheel;
    a ratchet gear formed in the hub;
    a first ratchet arm responsive to a downward force for engaging the ratchet gear and rotating the encoding wheel an incremental distance in one direction; and
    a second ratchet arm responsive to a downward force for engaging the ratchet gear and rotating the encoding wheel an incremental distance in an opposite direction.

11. The lighted coding switch of claim 1, wherein said means for supporting includes a collar for engaging the light source to prevent it from moving into the area within the rim and for defining a light seal around the light source.

12. In a lighted coding switch of a type that includes an encoding wheel with a rim along which symbols are inscribed and a mechanism for rotating the wheel to selectively display illuminated symbols and to generate electrical signals representative of the displayed symbols, the improvement comprising:
a housing having a back wall for rotatively supporting the encoding wheel and a peripheral side wall with a window for displaying a selected symbol of the wheel, the back wall having a first aperture positioned adjacent to the window and a second aperture spaced from the first aperture;
a light source for illuminating the selected symbol displayed in the window;
means for supporting the light source in said first aperture and outside the area defined within said rim; and
electrical conductors extending along the back wall and through said second aperture for applying power to the light source.

13. The lighted coding switch of claim 12, including a backplate for completely covering said light source and said electrical conductors.

* * * * *

UNITED STATES PATENT AND TRADEMARK OFFICE
CERTIFICATE OF CORRECTION

PATENT NO. : 4,354,080
DATED : October 12, 1982
INVENTOR(S) : Guenter Murmann

It is certified that error appears in the above-identified patent and that said Letters Patent is hereby corrected as shown below:

At page 1, in the list of Foreign Application Priority Data, delete "7931211[U]" and insert -- 7931211 --.

At page 1, in the list of Foreign Application Priority Data, delete "8026144[U]" and insert -- 8026144 --.

At page 1, in the list of U.S. Patent Documents, delete "1975" and insert --1978--.

At column 6, line 46, delete "backplate" and insert --back plate--.

At column 8, line 28, delete "backplate" and insert --back plate--.

At column 8, lines 31-32, delete "backplate" and insert --back plate--.

At column 8, line 36, delete "backplate" and insert --back plate--.

At column 8, lines 40-41, delete "backplate" and insert --back plate--.

UNITED STATES PATENT AND TRADEMARK OFFICE
CERTIFICATE OF CORRECTION

PATENT NO. : 4,354,080

DATED : October 12, 1982

INVENTOR(S) : Guenter Murmann

It is certified that error appears in the above-identified patent and that said Letters Patent is hereby corrected as shown below:

At column 8, line 48, after "includes", insert --:--.

At column 10, line 8, delete "backplate" and insert --back plate--.

Signed and Sealed this

*Twenty-first* Day of *August 1984*

[SEAL]

*Attest:*

GERALD J. MOSSINGHOFF

*Attesting Officer*  *Commissioner of Patents and Trademarks*